(12) United States Patent
Petti et al.

(10) Patent No.: US 6,946,719 B2
(45) Date of Patent: Sep. 20, 2005

(54) SEMICONDUCTOR DEVICE INCLUDING JUNCTION DIODE CONTACTING CONTACT-ANTIFUSE UNIT COMPRISING SILICIDE

(75) Inventors: Christopher J. Petti, Mountain View, CA (US); S. Brad Herner, San Jose, CA (US)

(73) Assignee: Matrix Semiconductor, Inc, Santa Clara, CA (US)

( * ) Notice: Subject to any disclaimer, the term of this patent is extended or adjusted under 35 U.S.C. 154(b) by 99 days.

(21) Appl. No.: 10/728,230

(22) Filed: Dec. 3, 2003

(65) Prior Publication Data

US 2005/0121742 A1 Jun. 9, 2005

(51) Int. Cl.[7] .............................................. H01L 29/00
(52) U.S. Cl. ......................... 257/530; 257/50; 257/529
(58) Field of Search .......................... 257/50, 529, 530

(56) References Cited

U.S. PATENT DOCUMENTS

| | | | |
|---|---|---|---|
| 5,693,556 A | * 12/1997 | Cleeves | 438/600 |
| 5,962,911 A | * 10/1999 | Manley | 257/530 |
| 6,034,882 A | 3/2000 | Johnson et al. | |
| 6,420,215 B1 | 7/2002 | Knall et al. | |
| 6,525,953 B1 | 2/2003 | Johnson | |
| 6,541,312 B2 | 4/2003 | Cleeves et al. | |

OTHER PUBLICATIONS

U.S. Appl. No. 10/185,507, filed Jun. 27, 2002, Vyvoda et al.
U.S. Appl. No. 10/326,470, filed Dec. 19, 2002, Herner et al.
U.S. Appl. No. 10/440,882, filed May 19, 2003, Vyvoda.
U.S. Appl. No. 10/610,804, filed Jun. 30, 2003, Herner et al.
Chiang, Steve.,et al. ,"Antifuse Structure Comparison for Field Programmable Gate Arrays", *IEDM 92–611*, (Apr. 1992),24.6.1–24.6.4.

Hamdy, Esmat.,et al. ,"Dielectric Based Antifuse for Logic and Memory ICs", *IEDM 88*, (1988), 786–789.

Herner, S..B. ,et al. ,"Polycrystalline silicon/CoSi2 Schottky diode with integrated SiO2 antifuse: a nonvolatile memory cell", *Applied Physics Letters*, vol. 82, No. 23, Jun. 9, 2003, 4163–4165.

Konakova, R..V. ,et al. ,"Ohmic Contacts for Microwave Diodes", *Proc. 22nd International Conference on Microelectronics (MIEL 2000)*, vol. 2, NIS, Serbia, May 14–17, 2000, (Jan. 1999), 477–480.

Shih, Chih–Ching.,et al. ,"Characterization and Modeling of a Highly Reliable Metal–to–Metal Antifuse for High–Performance and High–Density Field–Programmable Gate Arrays", *1997 IEEE*, (Sep. 1997),25–33.

Wang, Shoue–Jen.,et al. ,"High–Performance Metal/Silicide Antifuse," *IEEE Electron Device Letters*, vol. 13, No. 9, Sep. 1992, 471–472.

* cited by examiner

*Primary Examiner*—Andy Huynh
(74) *Attorney, Agent, or Firm*—Matrix Semiconductor, Inc.; Pamela J. Squyres

(57) ABSTRACT

The invention provides for a vertically oriented junction diode having a contact-antifuse unit in contact with one of its electrodes. The contact-antifuse unit is formed either above or below the junction diode, and comprises a silicide with a dielectric antifuse layer formed on and in contact with it. In preferred embodiments, the silicide is cobalt silicide, and the antifuse preferably silicon oxide, silicon nitride, or silicon oxynitride grown on the colbalt silicide. The junction diode and contact-antifuse unit can be used as a memory cell, which is advantageously used in a monolithic three dimensional memory array.

85 Claims, 4 Drawing Sheets

SEMICONDUCTOR DEVICE INCLUDING JUNCTION DIODE CONTACTING CONTACT-ANTIFUSE UNIT COMPRISING SILICIDE

RELATED APPLICATIONS

This application is related to Herner, U.S. application Ser. No. 10/727,765, "Use in Semiconductor Devices of Dielectric Antifuses Grown on Silicide," filed on even date herewith and hereby incorporated by reference.

BACKGROUND OF THE INVENTION

The invention relates to a novel combination of a junction diode and a contact-antifuse unit containing a silicide layer.

While a junction diode in electrical contact with an antifuse layer can be used effectively as a memory cell, the performance of such cells can be improved.

SUMMARY OF THE INVENTION

The present invention is defined by the following claims, and nothing in this section should be taken as a limitation on those claims. In general, the invention is directed to a novel combination of a junction diode and a contact-antifuse structure comprising a silicide and an antifuse layer.

A first aspect of the invention provides for a semiconductor device comprising a vertically oriented junction diode; a contact-antifuse unit, the unit comprising an antifuse layer and a layer of silicide, the antifuse layer on and in contact with the silicide layer, wherein the contact-antifuse unit is in contact with an electrode of the junction diode.

Another aspect of the invention provides for a semiconductor device comprising a vertically oriented junction diode; a contact-antifuse unit comprising a silicide layer and a dielectric layer, wherein the contact-antifuse unit is in contact with the junction diode and wherein the dielectric layer is grown on the silicide layer.

Yet another aspect of the invention provides for monolithic three dimensional memory array comprising a memory cell, the memory cell comprising a vertical junction diode; and a contact-antifuse unit, the unit comprising a silicide layer and an antifuse layer, wherein the silicide layer is in contact with the antifuse layer, wherein the contact-antifuse unit is in contact with the junction diode and wherein the memory array comprises at least a first memory level at a first height and a second memory level at a second height different from the first height.

Each of the aspects and embodiments of the invention described herein can be used alone or in combination with one another.

The preferred aspects and embodiments will now be described with reference to the attached drawings.

DETAILED DESCRIPTION OF THE INVENTION

A semiconductor junction diode, for example a p-n diode or a p-i-n diode, has been paired with a dielectric antifuse layer to form a memory cell, for example in the monolithic three dimensional memory array described in Herner et al., U.S. patent application Ser. No. 10/326,470, "An Improved Method for Making High Density Nonvolatile Memory," filed Dec. 19, 2002, hereinafter the '470 application, which is hereby incorporated by reference. In the array described in the '470 application, in preferred embodiments in an unprogrammed cell the antifuse layer separates the diode from a conductor.

Such an antifuse-diode memory cell is in an unprogrammed state before the antifuse layer is ruptured and is in a programmed state after antifuse rupture. In the array described in the '470 application, in an unprogrammed cell the antifuse layer electrically separates the diode from an adjacent conductor. Performance of such cells is strongly influenced by the characteristics of the antifuse layer and its adjacent layers. Ideally there is very little leakage current across the antifuse layer before it is ruptured, and high current after. Unintentional rupture of the antifuse layer, which may occur when a cell is being read or when a neighboring cell is written, is also to be avoided. Use of different materials, dopant concentrations, thicknesses of layers, etc., affect the leakage current, programmed current, and tendency of the cell to be unintentionally programmed.

The term junction diode is used herein to refer to a semiconductor device with the property of conducting current more easily in one direction than the other, having two terminal electrodes, and made of semiconducting material which is p-type at one electrode and n-type at the other. Examples include p-n diodes and n-p diodes, which have p-type semiconductor material and n-type semiconductor material in contact, and p-i-n and n-i-p diodes, in which intrinsic (undoped) semiconductor material is interposed between p-type semiconductor material and n-type semiconductor material.

Figure 1:
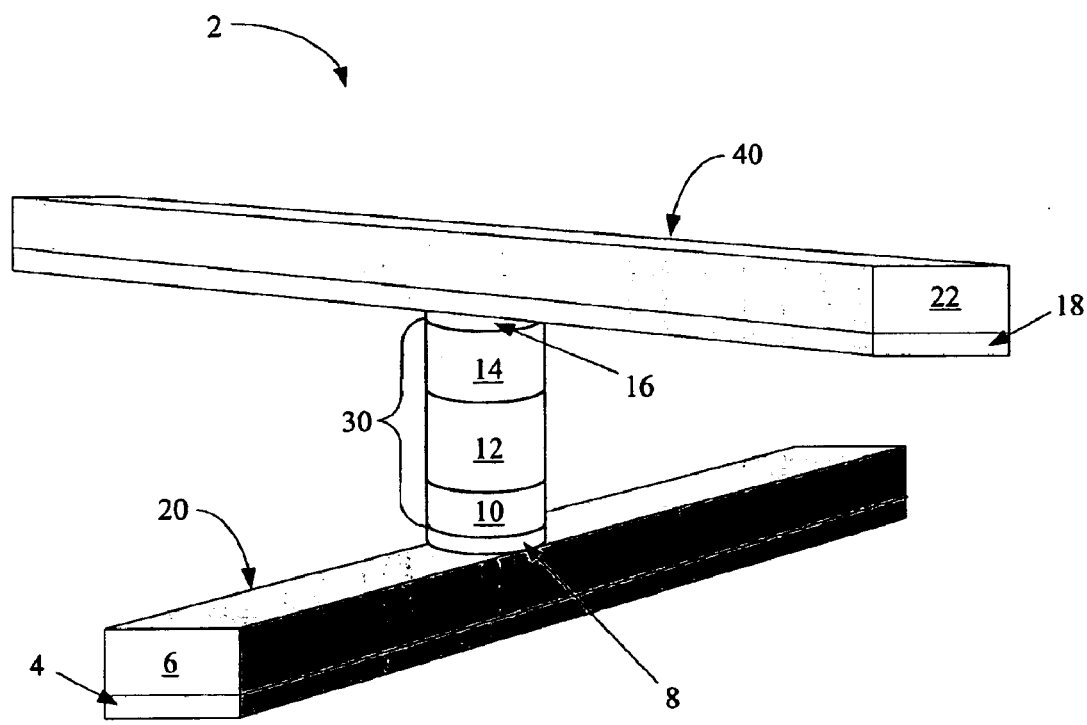
FIG. 1 is a perspective view of a memory cell according to the '470 application.

A preferred memory cell of the '470 application includes a vertically oriented junction diode disposed between conductors, the cell further having a dielectric antifuse layer interposed between the junction diode and one of the conductors. A memory cell 2 according to the '470 application is shown in FIG. 1. A first conductor 20 preferably comprises titanium nitride layer 4 and tungsten layer 6. Junction diode 30 is formed on optional titanium nitride barrier layer 8 and comprises heavily doped semiconductor layer 10 of a first conductivity type, layer 12 which is undoped semiconductor material or lightly doped semiconductor material of a second conductivity type, and heavily doped semiconductor layer 14 of the second conductivity type. A thin silicon dioxide antifuse layer 16 is formed on top of the junction diode 30. Second conductor 40 preferably comprises titanium nitride layer 18 and tungsten layer 22.

The memory cell 2 is unprogrammed when antifuse layer 16 is intact. To program the cell, a voltage sufficient to cause breakdown of the antifuse material is applied across antifuse layer 16. It is advantageous to maximize the difference in current between an unprogrammed cell and a programmed cell and to improve uniformity between cells. The present invention minimizes the distribution of forward current values after programming of such a cell, improving reliability of the memory array.

It has been found to be advantageous to juxtapose a combination of layers which will be called a contact-antifuse unit with a vertically oriented junction diode. The term contact-antifuse unit will be used herein to describe a silicide layer with a dielectric antifuse layer formed on and in contact with it. The contact-antifuse unit may contain other layers in addition to the silicide layer and the dielectric antifuse layer, and may be placed either above or below the vertically oriented junction diode.

Herner, U.S. application Ser. No. 10/095,962, "Silicide-Silicon Oxide-Semiconductor Antifuse Device and Method of Making," filed Mar. 13, 2002, hereinafter the '962 application and hereby incorporated by reference, teaches a method to grow silicon oxide on certain silicides when such silicides are formed directly over silicon. The application Ser. No. 10/727,765 of Herner (attorney docket number MA-070-1), filed on even date herewith, describes use of silicon oxide, silicon nitride, and silicon oxynitride dielectrics grown on the selected silicides. Any of these methods can advantageously be used to form the antifuse layer of the contact-antifuse unit of the present invention.

Examples will be given of two embodiments of the present invention. Detailed information regarding materials, process steps and dimensions will be provided, but it will be apparent to those skilled in the art that many of these details can be modified, added, or omitted while the result falls within the scope of the invention.

Contact-antifuse Unit Above Junction Diode

In one set of preferred embodiments, a contact-antifuse unit comprising a silicide and a dielectric antifuse layer is formed above a vertically oriented junction diode.

Figure 2A:
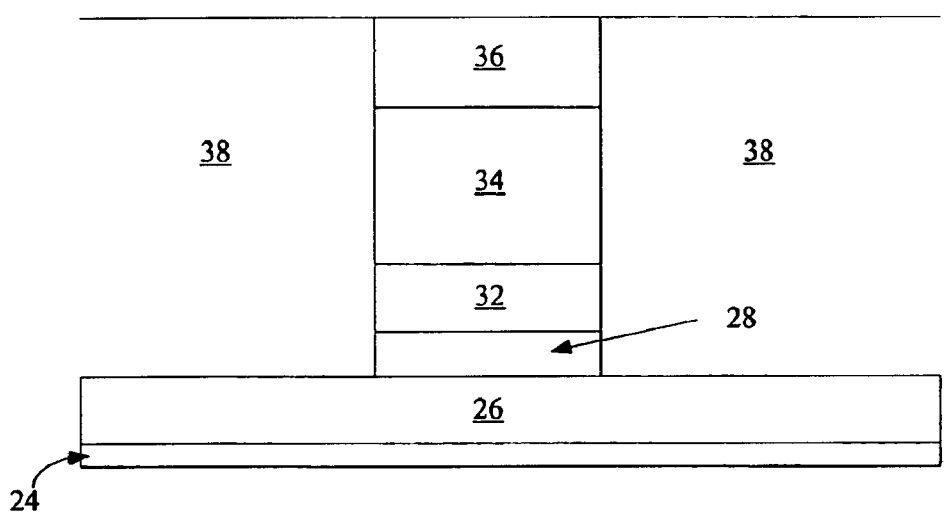
FIGS. 2a–2d are cross-sectional views illustrating fabrication of an embodiment of a memory cell according to the present invention.

Turning to FIG. 2a, formation of a memory level begins as in the '470 application: Layers of titanium nitride 24 and tungsten 26 are deposited, then patterned and etched to form substantially parallel conductors, shown extending across the page. Dielectric fill (not shown) is deposited between and over the conductors, then planarized, for example by chemical-mechanical polishing (CMP) to expose the tungsten 26 of the conductors.

A barrier layer 28, preferably 200 angstroms of titanium nitride, is optionally deposited on the planarized conductors and fill. Next polycrystalline silicon, herein referred to as polysilicon, is deposited to form layers of a junction diode. (In the present invention, silicon can either be deposited in polycrystalline form or deposited amorphous and crystallized later, for example by subsequent thermal processing.) In this example, a first layer 32 of about 400 angstroms of in-situ doped polysilicon doped with boron is deposited to form a p-type polysilicon layer. This first layer 32 is preferably heavily doped, i.e. with a dopant concentration of about $1 \times 10^{19}$ to about $2 \times 10^{21}$ atoms/cm$^3$, preferably about $1 \times 10^{20}$ atoms/cm$^3$. Next about 4300 angstroms of undoped, or intrinsic, polysilicon is deposited. The polysilicon is patterned and etched to form polysilicon pillars, each pillar on top of a conductor. Some misalignment can be tolerated.

Gaps between the patterned pillars are filled with dielectric fill 38, then the fill is planarized, for example by CMP, to expose polysilicon. Ion implantation with an n-type dopant, for example phosphorus, is performed to dope a top region 36 of the pillar. A middle region of the pillar 34, below the n-doped region at the top, remains lightly doped or undoped. (In alternative embodiments, about 2900 angstroms of undoped polysilicon region 34 is deposited, followed by about 1400 angstroms of in-situ doped polysilicon region 36 doped with an n-type dopant, for example phosphorus.) The resulting structure is shown in FIG. 2a.

A junction diode having a first, bottom electrode of p-type material and a second, top electrode of n-type material was described. Clearly the inverted diode, with the n-type electrode at the bottom and the p-type electrode at the top at the top, could have been used instead.

Figure 2B:
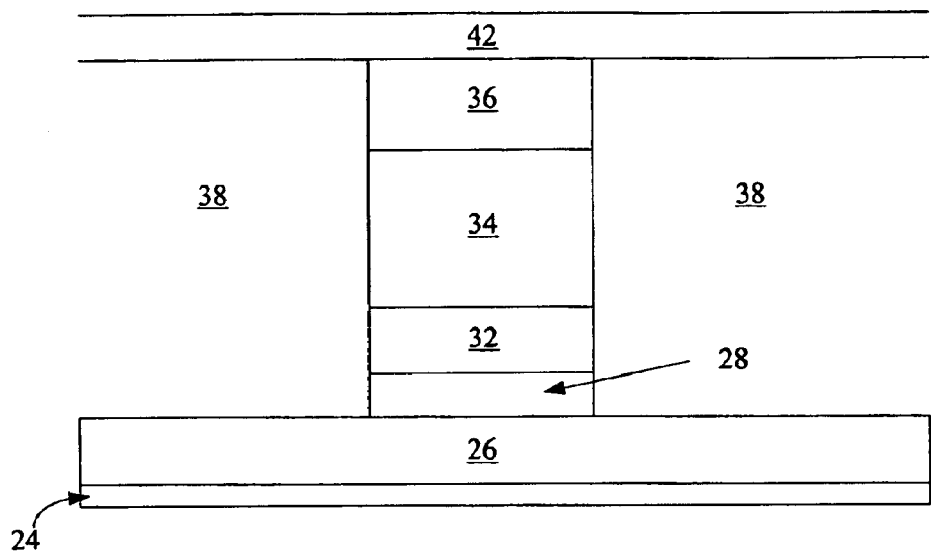

Turning to FIG. 2b, after an optional 50 angstrom presputter etch to remove any native oxide or particle defects, about 20 to about 400 angstroms, preferably about 50 to about 120 angstroms, most preferably about 85 angstroms, of cobalt 42 is deposited on the dielectric 38 and exposed pillars. Cobalt can be deposited by any conventional method, for example by sputtering. Other metals can be used in place of cobalt, including chromium, nickel, platinum, niobium, palladium, tantalum, or titanium. For simplicity, this description will detail the use of cobalt, but it will be understood that any of these other metals can be substituted as appropriate.

Optionally, a capping layer of about 200 angstroms, preferably of titanium or titanium nitride, is deposited on the cobalt (not shown.) The titanium or titanium nitride cap assists in the subsequent conversion of the cobalt layer to cobalt silicide.

Figure 2C:
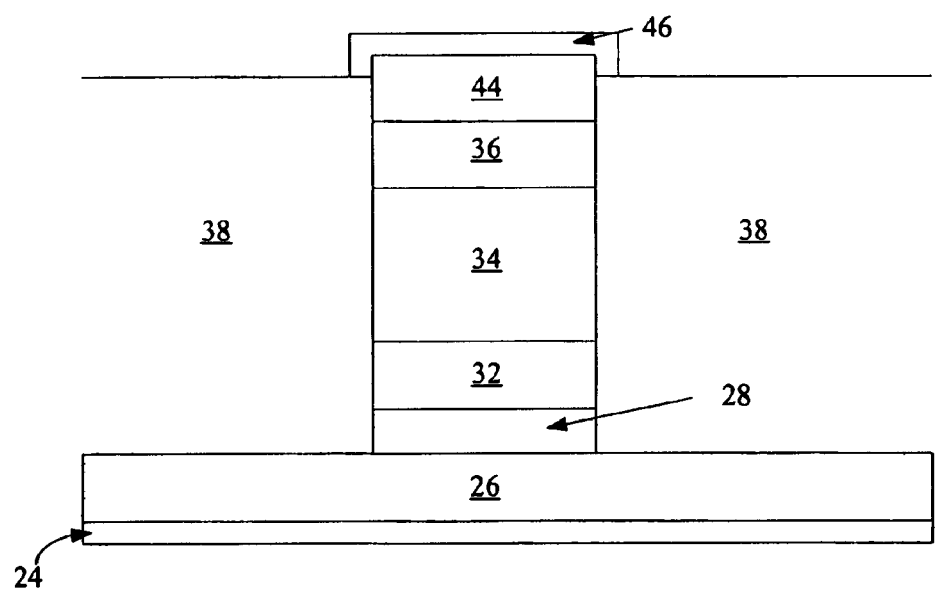

Turning to FIG. 2c, an anneal is performed at a suitable temperature to react the cobalt with the polysilicon of the exposed diodes to form cobalt silicide 44 on the diodes only; no silicide is formed where the cobalt overlies oxide fill 38. For example, the anneal may be performed in a rapid thermal annealing system at about 400 to about 700 degrees C. for about 20 to about 100 seconds, preferably at about 500 degrees C. for about 30 seconds. The capping layer and unreacted portions of the cobalt are removed by a selective etch. Any etching medium which selectively etches the capping layer and the unreacted cobalt while leaving cobalt silicide may be used. Preferably, selective wet etching is used.

A second anneal is performed to homogenize the cobalt silicide 44 to CoSi$_2$. This anneal is performed at a temperature from about 650 degrees C. to about 850 degrees C. for about 10 to about 60 seconds, preferably at about 750 degrees C. for about 30 seconds. This second anneal can be performed at any time after the first. In a multi-level memory array, preferably a single anneal is performed after all of the memory levels are constructed to homogenize the cobalt silicide. Alternatively, the second anneal can be combined with antifuse growth.

Next a dielectric layer 46 is grown on the cobalt silicide 44. For example, silicon oxide is grown by exposing the silicide layer 44 to an oxygen atmosphere in a rapid thermal annealing system, preferably at about 670 to about 750 degrees C. for about 20 to about 60 seconds. If the second anneal to homogenize cobalt silicide is to be performed in the same thermal process as antifuse growth, this step can be performed at about 600 to about 850 degrees C, preferably at about 750 degrees C., for about 20 to about 300 seconds, preferably about 120 seconds. The resulting oxide is preferably between about 25 and about 200 angstroms thick, more preferably between about 100 and 150 angstroms thick, most preferably about 150 angstroms thick. Other methods may be used, including as any of those taught in the '962 application. Silicon oxide can be grown on cobalt silicide, nickel silicide, platinum silicide, palladium silicide, niobium silicide, tantalum silicide, or chromium silicide. The structure at this point is shown in FIG. 2c. Note that some but not all of the top heavily doped region 36 has been consumed by the silicide reaction.

Other dielectrics can be grown instead. A silicon nitride layer can be grown, for example by flowing 4 liters/minute of NH$_3$ at 750 degrees for 60 seconds at atmospheric pressure; the ramp rate is 50 degrees/second. Alternate source gases that may be used are NO and N$_2$O, as taught in the Herner application filed on even date herewith Ser. No. 10/727,765. A silicon oxynitride layer can be grown by exposing a silicide to an oxygen- and nitrogen-containing ambient, or, for example, by exposing a silicide to oxygen- and nitrogen-containing ambients in sequence, i.e. nitriding a grown oxide or oxidizing a grown nitride; these methods are also taught in the same application. None of the methods of the '962 application or of Herner, filed on even date herewith, is intended to be excluded. Silicon nitride or silicon oxynitride can be grown on cobalt silicide, nickel silicide, platinum silicide, palladium silicide, niobium silicide, tantalum silicide, or chromium silicide.

If a silicon oxide antifuse layer is grown, the silicon oxide antifuse layer preferably comprises stoichiometric silicon dioxide, but also may include a non-stoichiometric silicon oxide layer (i.e., a layer having a silicon to oxygen ratio of other than 1:2.) Similarly, silicon nitride may or may not be stoichiometric Si$_3$N$_4$.

If titanium was deposited in place of cobalt and titanium silicide was formed in place of cobalt silicide layer 44, exposure to an oxygen atmosphere at about 700 degrees C. for about 30 seconds will form thermally grown titanium oxide on the titanium silicide. The titanium oxide can replace the silicon oxide, silicon nitride, or silicon oxynitride of the antifuse layer 46.

In less preferred embodiments, a dielectric antifuse layer can be deposited rather than grown on the silicide layer 44. For example, this layer can be deposited by atomic layer deposition, or by some other chemical vapor deposition (CVD) process.

Figure 2D:
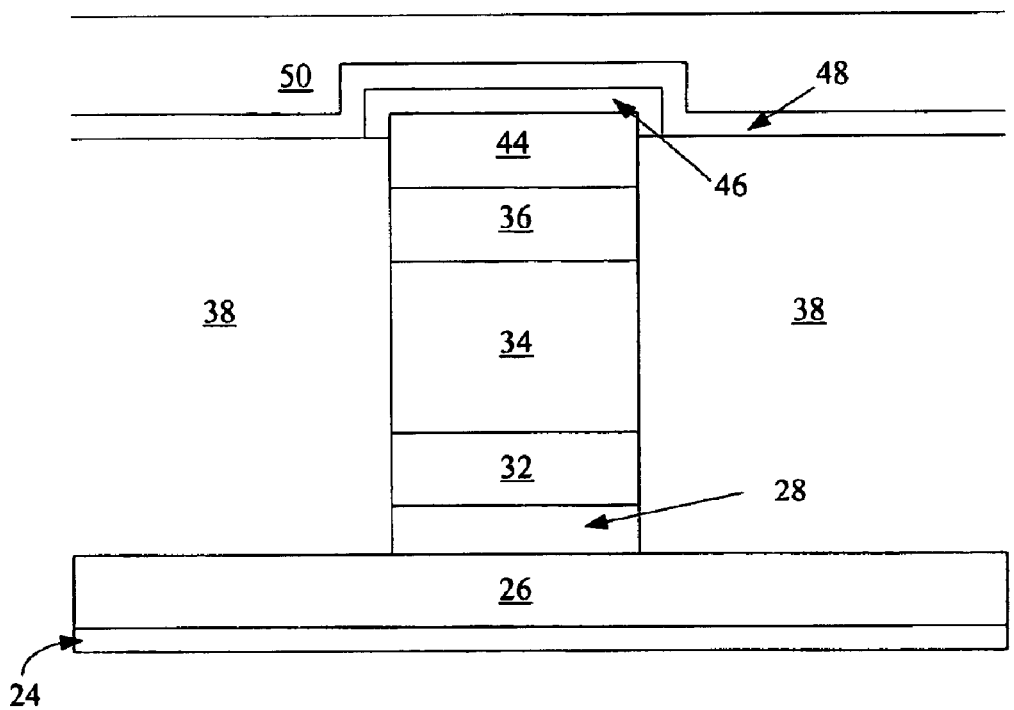

Formation of the overlying conductors proceeds as in the '470 application. Continuing to FIG. 2d, an adhesion layer 48 is deposited, preferably 200 angstroms of conductive material, preferably titanium nitride. Tantalum nitride, tungsten nitride, tantalum, or titanium tungsten can be substituted for titanium nitride. In the '470 application, a titanium nitride layer deposited immediately over the silicon oxide antifuse may be deposited using a physical vapor deposition (PVD) process without applied self-bias; a PVD process is typically performed at about 0.5 to about 5 mTorr. This technique is used, rather than a self-biased PVD process, to avoid damaging the fragile silicon dioxide antifuse layer. This deposition method may optionally be employed for this layer. The resulting layer of titanium nitride will have lower density and higher resistivity than conventionally formed titanium nitride, and will decrease leakage current across the antifuse before antifuse rupture. Formation and use of this low-density, high-resistivity titanium nitride is described in Herner, U.S. patent application Ser. No. 10/611,245, "Low Density, High Resistivity Titanium Nitride Layer for Use as a Contact for Low-Leakage Dielectric Layers," filed Jun. 30, 2003, hereinafter the '245 application, hereby incorporated by reference.

About 1700 angstroms of tungsten 50 is deposited on the titanium nitride layer, then the tungsten and titanium nitride layers are patterned and etched to form substantially parallel evenly spaced second conductors. The second conductors are preferably substantially perpendicular to the first conductors. The junction diode is preferably aligned at the intersection of the first conductor below it and the second conductor above it, but some misalignment can be tolerated.

The resulting structure includes a vertically oriented junction diode. This junction diode can be a p-n diode or a p-i-n diode, with the p-type electrode at the bottom and the n-type electrode at the top or vice versa. The junction diode preferably comprises a first heavily doped layer of a first conductivity type, a second undoped or lightly doped layer of a second conductivity type, and a third heavily doped layer of a second conductivity type. Above and in contact with an electrode of the junction diode is a contact-antifuse unit. The contact-antifuse unit comprises a silicide and an antifuse layer formed on the silicide, which is thus on and in contact with the silicide. The antifuse layer is preferably silicon oxide, silicon nitride, or silicon oxynitride, and is preferably grown, preferably thermally grown, on the silicide. The silicide of the contact-antifuse unit is in contact with an electrode of the junction diode. The contact-antifuse unit further comprises a layer above the antifuse layer which is titanium nitride, tantalum nitride, tungsten nitride, tantalum, or titanium tungsten. The junction diode and contact-antifuse unit are portions of a memory cell, which is part of a memory array. The memory array may be a portion of a monolithic three dimensional memory array.

Contact-antifuse Unit Below Junction Diode

In another set of preferred embodiments, a contact-antifuse unit comprising a silicide and a dielectric antifuse layer is formed below a vertically oriented junction diode.

Figure 3A:
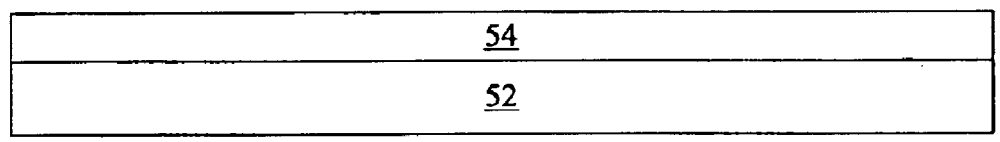
FIGS. 3a–3c are cross-sectional views illustrating fabrication of a different embodiment of a memory cell according to the present invention.

In this embodiment, the first titanium nitride-tungsten conductors of the '470 application are replaced with silicon lines 52, shown in FIG. 3a. A layer of amorphous silicon or polysilicon, preferably about 1500–2500 angstroms thick, most preferably about 2500 angstroms thick, which may be undoped or may be doped with n-type or p-type dopants, is deposited. N-type doped amorphous silicon is preferred. This silicon layer will typically be amorphous as deposited, but will become polycrystalline during subsequent thermal processing. The silicon layer is patterned and etched to form a plurality of substantially parallel lines. The gaps between the lines are filled with dielectric fill (not shown), preferably silicon dioxide. The gap fill is planarized, preferably by CMP, to expose the silicon lines.

Alternatively, silicon lines can be formed in the surface of a monocrystalline wafer by etching trenches and filling them with a dielectric using conventional techniques. Similarly, the silicon lines 52 can be formed in the surface of a silicon on insulator substrate or a layer of epitaxially grown silicon.

After an optional 50 angstrom pre-sputter etch to remove any native oxide or particle defects, about 20 to about 500 angstroms, preferably about 300 to 400 angstroms, most preferably about 300 angstroms of cobalt is deposited on the dielectric and exposed silicon lines 52. The preferred thickness of the cobalt layer is thicker in this embodiment than in the previous embodiment because the resulting cobalt silicide layer will serve as wiring within the array. A layer of cobalt 54 can be deposited by any conventional method, for example by sputtering. Other metals can be used in place of the cobalt, including chromium, nickel, platinum, niobium, palladium, tantalum, or titanium. For simplicity, this description will detail the use of cobalt, but it will be understood that any of these other metals can be substituted as appropriate.

Optionally, a capping layer of about 200 angstroms, preferably of titanium or titanium nitride (not shown), is deposited on the cobalt 54. The titanium or titanium nitride cap assists in the subsequent conversion of the cobalt layer to cobalt silicide.

Figure 3B:
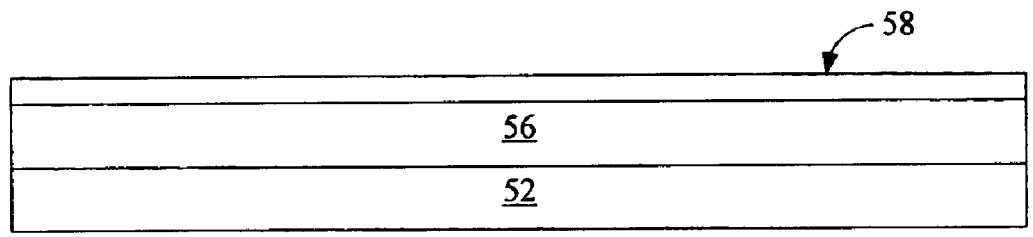

An anneal is performed at a suitable temperature to react the cobalt with the polysilicon of the exposed silicon lines to form cobalt silicide 56 on the silicon lines 52, shown in FIG. 3b. For example, the anneal may be performed in a rapid thermal annealing system at about 400 to about 700 degrees C. for about 20 to about 100 seconds, preferably at about 500 degrees C. for about 30 seconds. The capping layer and unreacted portions of the cobalt are removed by a selective etch. Any etching medium which selectively etches the capping layer and the unreacted cobalt while leaving cobalt silicide 56 may be used. Preferably, selective wet etching is used. Some thickness of the silicon lines 52 has been consumed by the silicide reaction.

A second anneal is performed to homogenize the cobalt silicide 56 to $CoSi_2$. This anneal is performed at a temperature from about 550 degrees C. to about 800 degrees C. for about 30 to about 60 seconds, preferably at about 740 degrees C. for about 30 seconds. This second anneal can be performed at any time after the first. In a multi-level memory array, preferably a single anneal is performed after all of the memory levels are constructed to homogenize the cobalt silicide. Alternatively, the second anneal can be combined with antifuse growth.

Next a dielectric layer 58 is thermally grown on the cobalt silicide 56. For example, silicon oxide is grown by exposing the silicide layer 56 to an oxygen atmosphere in a rapid thermal annealing system, preferably at about 670 to about 750 degrees C. for about 20 to about 60 seconds. If the second anneal to homogenize cobalt silicide is to be performed in the same thermal process as antifuse growth, this step can be performed at about 600 to about 850 degrees C., preferably at about 750 degrees C., for about 20 to about 300 seconds, preferably about 120 seconds. Other methods may be used, including as any of those taught in the '962 application. Silicon oxide can be grown on cobalt silicide, nickel silicide, platinum silicide, palladium silicide, tantalum silicide or chromium silicide. As will be described below, a thin layer of titanium nitride may be deposited next. The preferred thickness of the antifuse (and thus the conditions used to produce it) varies according to whether or not this layer is present.

Other dielectrics can be grown instead. A silicon nitride layer can be grown, for example by flowing 4 liters/minute of $NH_3$ at 750 degrees for 60 seconds at atmospheric pressure; the ramp rate is 50 degrees/second. Alternate source gases that may be used are NO and $N_2O$, as taught in the Herner application filed on even date herewith. A silicon oxynitride layer can be grown by exposing a silicide to an oxygen- and nitrogen-containing ambient, or, for example, by exposing a silicide to oxygen- and nitrogen-containing ambients in sequence, i.e. nitriding a grown oxide or oxidizing a grown nitride; these methods are also taught in the same application. None of the methods of this application or of the '962 application is intended to be excluded. Silicon nitride or silicon oxynitride can be grown on cobalt silicide, nickel silicide, platinum silicide, palladium silicide, tantalum silicide, or chromium silicide.

If a silicon oxide antifuse layer is grown, the silicon oxide antifuse layer preferably comprises stoichiometric silicon dioxide, but also may include a non-stoichiometric silicon oxide layer (i.e., a layer having a silicon to oxygen ratio of other than 1:2.) Similarly, silicon nitride may or may not be stoichiometric $Si_3N_4$.

Figure 3C:
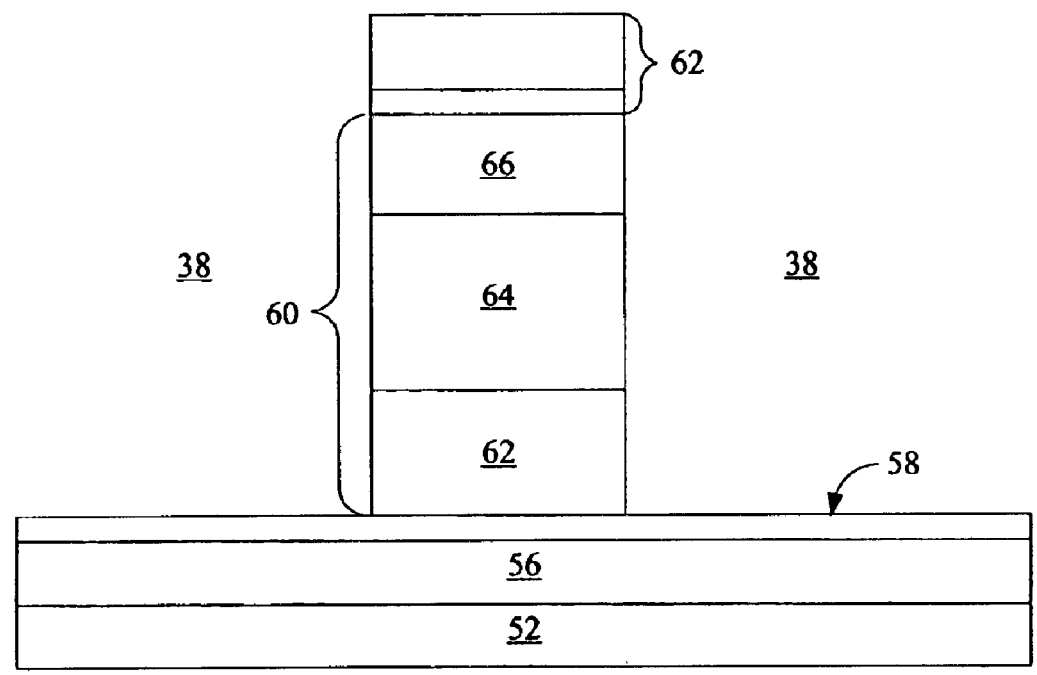

Turning to FIG. 3c, formation of the overlying junction diode 60 proceeds as in the '470 application and as in the earlier description of the contact-antifuse unit formed above the junction diode. As before, in this example layer 62 is a heavily doped layer of a first conductivity type, layer 64 is an undoped layer or a lightly doped layer of a second conductivity type, and layer 66 is a heavily doped layer of the second conductivity type. The polysilicon layers that will form the junction diode are deposited, patterned, and etched to form pillars, and the gaps between the pillars are filled with dielectric fill 38, preferably silicon dioxide. Another semiconductor material, for example silicon-germanium or germanium, could replace the silicon forming this junction diode.

It may be desirable, after formation of dielectric antifuse layer 58 and before deposition of the polysilicon that will form the junction diode 60, to deposit a thin layer of conductive material, preferably titanium nitride, tantalum nitride, tungsten nitride, tantalum, or titanium tungsten (not shown.) It may be advantageous to use the low-density, high-resistivity titanium nitride (or tantalum nitride, tungsten nitride, tantalum, or titanium tungsten) described in the '245 application employed for this layer. The resulting layer of titanium nitride will have lower density and higher resistivity than conventionally formed titanium nitride, and will decrease leakage current across the antifuse before antifuse rupture.

If this layer of titanium nitride or another metal or metal-like material is included with a silicon oxide antifuse, the silicon oxide antifuse is preferably about 25 to about 200 angstroms thick, more preferably between about 100 and 150 angstroms thick, most preferably about 150 angstroms thick. If this layer is omitted, the silicon oxide antifuse is preferably about 25 to about 200 angstroms thick, more preferably between about 50 and 100 angstroms thick, most preferably about 60 angstroms thick.

In the present embodiment, the antifuse layer 58 separating the junction diode from an adjacent conductor (cobalt silicide layer 56) is formed at the bottom of junction diode 60. In contrast with the '470 application, then, in the present embodiment no antifuse layer is formed at the top of the diode.

Formation of the overlying conductors proceeds as in the '470 application, and as in the earlier description of the contact-antifuse unit formed above the junction diode. Since, in the present embodiment, no antifuse is formed at the top of the junction diode, a self-biased PVD process can be used if preferred to form titanium nitride at the bottom of the overlying conductors. Optionally, a silicide, for example titanium silicide or cobalt silicide can be formed prior to or at the same time as the formation of the overlying conductors. The structure at this point, including junction diode 60, which is surrounded by dielectric fill 38, and overlying conductor 62, is shown in FIG. 3c. (Recall that overlying conductor 62 is substantially perpendicular to silicon line 52 and cobalt silicide 56 and is thus shown here in cross section.)

The resulting structure includes a vertically oriented junction diode. This junction diode can be a p-n diode or a p-i-n diode, with the p-type electrode at the bottom and the n-type electrode at the top or vice versa. Below and in contact with an electrode of the junction diode is a contact-antifuse unit. The contact-antifuse unit comprises a silicide and an antifuse layer formed on the silicide. The antifuse layer is preferably silicon oxide, silicon nitride, or silicon oxynitride, and is preferably grown, preferably thermally grown on the silicide. The contact-antifuse unit optionally further comprises a layer above the antifuse layer which is a conductive material, for example titanium nitride, tantalum nitride, tungsten nitride, tantalum, or titanium tungsten. If this optional layer of conductive material is present, it is in contact with an electrode of the junction diode. If it is absent, the antifuse is on contact with an electrode of the junction diode. The junction diode and contact-antifuse unit are portions of a memory cell, which is part of a memory array. The memory array may be a portion of a monolithic three dimensional memory array.

It has been described that the dielectric antifuse of the contact-antifuse unit of the present invention preferably includes a grown dielectric, such as an oxide. A grown oxide is one formed by converting a portion of the underlying silicide/silicon film stack to silicon oxide by exposing the silicide layer to an oxygen-containing ambient. Without wishing to be bound by any particular theory, it is believed that silicon from the underlying silicon layer in the stack diffuses through the cobalt silicide layer to react with the oxygen-containing ambient to form a layer which substantially comprises silicon oxide. Alternatively, if a relatively thin dielectric is to be grown on a silicide which is not formed on an underlying silicon layer, it is believed that silicon can be depleted from the silicide, leaving a relatively silicon-poor silicide.

For example, the grown oxide may be formed by dry oxidation (i.e., exposing the silicide to an oxygen-containing gas), wet oxidation (e.g., exposing the silicide to hot steam), plasma-enhanced oxidation (i.e., exposing the silicide to an oxygen plasma), chemical oxidation (i.e., exposing the silicide to an oxidizing liquid) and electrochemical oxidation (such as anodic oxidation). In contrast to a grown silicon oxide layer, a deposited silicon oxide layer is formed on a surface by providing silicon and oxygen atoms to the surface. For example, a silicon oxide layer is deposited by CVD or sputtering.

Similarly, a grown silicon nitride is formed by exposing the silicide to a nitrogen-containing ambient, while a grown silicon oxynitride is grown, for example, by exposing the silicide to an oxygen- and nitrogen-containing ambient. In contrast to a grown silicon nitride layer, a deposited silicon nitride layer is formed on a surface by providing silicon and nitrogen atoms to the surface; a deposited silicon oxynitride layer is formed by providing silicon, oxygen, and nitrogen atoms to the surface. A grown dielectric refers to a dielectric grown as per the preceding descriptions, such as grown silicon oxide, grown silicon nitride, or grown silicon oxynitride.

A grown dielectric, such as the silicon oxide, silicon nitride, or silicon oxynitride described earlier, is generally measurably different from a deposited oxide of the same material. The grown dielectric layer has fewer defects and is generally denser than a corresponding deposited dielectric and forms a higher quality antifuse. Further, a grown dielectric can reliably be produced thinner than can a corresponding deposited dielectric. Dielectrics can of 50 angstroms or less, for example, can be grown, while it is very difficult or impossible to reliably deposit a dielectric layer this thin. A grown dielectric is also preferable in that processing to produce it is simpler and less costly than for a deposited dielectric.

The various embodiments of junction diodes and contact-antifuse unit combinations (i.e., contact-antifuse unit above or below the junction diode) according to the present invention can be used alone or combined with each other. Similarly, either or both can be combined in a memory array with the diode-antifuse memory cells of the '470 application which do not include a silicide layer.

As has been described, memory cells according to the present invention are advantageously used in a monolithic three dimensional memory array in which multiple memory levels are formed, the levels formed above a substrate and stacked vertically one above the other. Preferred embodiments having the contact-antifuse unit below the junction diode have the first level junction diode disposed between first silicon lines with cobalt silicide on them (these lines below the first level junction diode), and second conductors comprising titanium nitride and tungsten (these conductors formed above the first level junction diode.)

A second memory level is typically formed above this first level. In one preferred arrangement, the second level junction diodes formed above the second conductors, in the second memory level, are the diodes described in the '470 application, which have an antifuse grown on silicon at the top of the diode and which do not include a silicide layer. The second level diodes may be upside-down relative to the first level diodes; i.e. the first layer formed is heavily doped n-type silicon, the next layer is intrinsic or lightly doped p-type silicon (with a dopant concentration of, for example, about $1\times10^{15}$ to about $1\times10^{18}$ atoms/cm$^3$, and preferably about $1\times10^{16}$ atoms/cm$^3$), and the top layer is heavily doped p-type silicon. The third conductors formed above the second level junction diodes are preferably the usual titanium nitride-tungsten conductors of the '470 application, and are preferably substantially perpendicular to the second conductors.

It will be recalled that embodiments of the present invention having the contact-antifuse unit below the junction diode are preferably fabricated on silicon lines with silicide formed atop them, not on titanium-tungsten conductors. Thus another set of bottom contact-antifuse unit cells cannot be fabricated directly on titanium nitride-tungsten third conductors. In an advantageous arrangement, a dielectric layer covers the two memory levels formed so far, and is planarized. Construction of more memory levels, not sharing conductors with the two existing memory levels, begins anew atop this interlevel dielectric. Two more memory levels identical to the first two can then be fabricated, or memory levels employing other cells can be fabricated instead.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The combination of a junction diode and a contact-antifuse unit comprising a silicide and a dielectric antifuse layer has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array.

It will be understood that the junction diode and contact-antifuse unit according to the present invention can be used other contexts, for example in a two dimensional memory array, the devices formed at least partially in a monocrystalline substrate.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A semiconductor device comprising:
  a vertically oriented junction diode;
  a contact-antifuse unit, the unit comprising an antifuse layer and a layer of silicide, the antifuse layer on and in contact with the silicide layer, wherein
  the contact-antifuse unit is in contact with an electrode of the junction diode.

2. The semiconductor device of claim 1 wherein the junction diode comprises:
  a first layer of heavily doped semiconductor material of a first conductivity type;
  a second layer of either a) lightly doped semiconductor material of a second conductivity type or of b) undoped semiconductor material, the second layer on and in contact with the first layer; and
  a third layer of heavily doped semiconductor material of the second conductivity type, the third layer on and in contact with the second layer.

3. The semiconductor device of claim 2 wherein the silicide is selected from the group consisting of cobalt silicide, chromium silicide, tantalum silicide, platinum silicide, nickel silicide, niobium silicide, and palladium silicide.

4. The semiconductor device of claim 3 wherein the antifuse layer comprises a grown dielectric.

5. The semiconductor device of claim 4 wherein the dielectric is silicon oxide.

6. The semiconductor device of claim 4 wherein the dielectric is silicon nitride.

7. The semiconductor device of claim 4 wherein the dielectric is silicon oxynitride.

8. The semiconductor device of claim 4 wherein the antifuse layer is in contact with the electrode of the junction diode.

9. The semiconductor device of claim 8 wherein the semiconductor material of the junction diode is polysilicon or polysilicon-germanium or germanium.

10. The semiconductor device of claim 9 wherein the first conductivity type is p-type.

11. The semiconductor device of claim 9 wherein the first conductivity type is n-type.

12. The semiconductor device of claim 8 wherein the silicide is cobalt silicide.

13. The semiconductor device of claim 8 wherein the junction diode and contact-antifuse unit are portions of a memory cell.

14. The semiconductor device of claim 13 wherein the memory cell is a portion of a memory array.

15. The semiconductor device of claim 14 wherein the memory array is a monolithic three dimensional memory array, the array comprising at least a first memory level formed at a first height and a second memory level formed at a second height different from the first height.

16. The semiconductor device of claim 2 wherein the silicide layer is in contact with the electrode of the junction diode.

17. The semiconductor device of claim 16 wherein the silicide is selected from the group consisting of cobalt silicide, chromium silicide, tantalum silicide, platinum silicide, nickel silicide, niobium silicide, and palladium silicide.

18. The semiconductor device of claim 17 wherein the antifuse layer comprises a dielectric grown on the silicide layer.

19. The semiconductor device of claim 18 wherein the dielectric is silicon oxide.

20. The semiconductor device of claim 18 wherein the dielectric is silicon nitride.

21. The semiconductor device of claim 18 wherein the dielectric is silicon oxynitride.

22. The semiconductor device of claim 18 wherein the semiconductor material of the junction diode is polysilicon.

23. The semiconductor device of claim 22 wherein the first conductivity type is p-type.

24. The semiconductor device of claim 22 wherein the first conductivity type is n-type.

25. The semiconductor device of claim 18 wherein the silicide is cobalt silicide.

26. The semiconductor device of claim 18 wherein the junction diode and contact-antifuse unit are portions of a memory cell.

27. The semiconductor device of claim 26 wherein the memory cell is a portion of a memory array.

28. The semiconductor device of claim 27 wherein the memory array is a monolithic three dimensional memory array, the array comprising at least a first memory level formed at a first height and a second memory level formed at a second height different from the first height.

29. The semiconductor device of claim 2 wherein the contact-antifuse unit further comprises a layer of conductive material in contact with the antifuse layer, wherein the conductive material is a member of a group consisting of titanium nitride, tantalum nitride, tungsten nitride, tantalum, and titanium tungsten.

30. The semiconductor device of claim 29 wherein the conductive material layer is in contact with the electrode of the junction diode.

31. The semiconductor device of claim 30 wherein the silicide is selected from the group consisting of cobalt silicide, chromium silicide, tantalum silicide, platinum silicide, nickel silicide, niobium silicide, and palladium silicide.

32. The semiconductor device of claim 31 wherein the antifuse layer comprises a dielectric grown on the silicide.

33. The semiconductor device of claim 32 wherein the dielectric is silicon oxide.

34. The semiconductor device of claim 32 wherein the dielectric is silicon nitride.

35. The semiconductor device of claim 32 wherein the dielectric is silicon oxynitride.

36. The semiconductor device of claim 32 wherein the semiconductor material of the junction diode is polysilicon or polysilicon-germanium or germanium.

37. The semiconductor device of claim 36 wherein the first conductivity type is p-type.

38. The semiconductor device of claim 36 wherein the first conductivity type is n-type.

39. The semiconductor device of claim 32 wherein the silicide is cobalt silicide.

40. The semiconductor device of claim 30 wherein the junction diode and contact-antifuse unit are portions of a memory cell.

41. The semiconductor device of claim 40 wherein the memory cell is a portion of a memory array.

42. The semiconductor device of claim 41 wherein the memory array is a monolithic three dimensional memory array, the array comprising at least a first memory level formed at a first height and a second memory level formed at a second height different from the first height.

43. The semiconductor device of claim 29 wherein the silicide layer is in contact with the electrode of the junction diode.

44. The semiconductor device of claim 43 wherein the silicide is selected from the group consisting of cobalt silicide, chromium silicide, tantalum silicide, platinum silicide, nickel silicide, niobium silicide, and palladium silicide.

45. The semiconductor device of claim 44 wherein the antifuse layer comprises a dielectric grown on the silicide.

46. The semiconductor device of claim 45 wherein the dielectric is silicon oxide.

47. The semiconductor device of claim 45 wherein the dielectric is silicon nitride.

48. The semiconductor device of claim 45 wherein the dielectric is silicon oxynitride.

49. The semiconductor device of claim 43 wherein the semiconductor material of the junction diode is polysilicon.

50. The semiconductor device of claim 49 wherein the first conductivity type is p-type.

51. The semiconductor device of claim 49 wherein the first conductivity type is n-type.

52. The semiconductor device of claim 45 wherein the silicide is cobalt silicide.

53. The semiconductor device of claim 43 wherein the junction diode and the contact-antifuse unit are portions of a memory cell.

54. The semiconductor device of claim 53 wherein the memory cell is a portion of a memory array.

55. The semiconductor device of claim 54 wherein the memory array is a monolithic three dimensional memory array, the array comprising at least a first memory level formed at a first height and a second memory level formed at a second height different from the first height.

56. The semiconductor device of claim 29 wherein the conductive material layer is titanium nitride.

57. The semiconductor device of claim 2 wherein the antifuse layer is a grown metal oxide.

58. The semiconductor device of claim 57 wherein the silicide is titanium silicide.

59. A semiconductor device comprising:
 a vertically oriented junction diode;
 a contact-antifuse unit comprising a silicide layer and a dielectric layer, wherein the contact-antifuse unit is in contact with the junction diode and wherein the dielectric layer is grown on the silicide layer.

60. The semiconductor device of claim 59 wherein the contact-antifuse unit is above the junction diode.

61. The semiconductor device of claim 60 wherein the silicide is selected from the group consisting of cobalt silicide, chromium silicide, tantalum silicide, platinum silicide, nickel silicide, niobium silicide, and palladium silicide.

62. The semiconductor device of claim 61 wherein the silicide is cobalt silicide.

63. The semiconductor device of claim 60 wherein the junction diode comprises:
- a first layer of heavily doped semiconductor material of a first conductivity type;
- a second layer of lightly doped semiconductor material of a second conductivity type or of intrinsic, undoped semiconductor material, the second layer on and in contact with the first layer; and
- a third layer of heavily doped semiconductor material of the second conductivity type, the third layer on and in contact with the second layer.

64. The semiconductor device of claim 63 wherein the semiconductor material is polysilicon.

65. The semiconductor device of claim 60 wherein the junction diode and contact-antifuse unit are portions of a memory cell.

66. The semiconductor device of claim 65 wherein the memory cell is a portion of a memory array.

67. The semiconductor device of claim 66 wherein the memory array is a monolithic three dimensional memory array, the array comprising at least a first memory level formed at a first height and a second memory level formed at a second height different from the first height.

68. The semiconductor device of claim 59 wherein the contact-antifuse unit is below the junction diode.

69. The semiconductor device of claim 68 wherein the silicide is selected from the group consisting of cobalt silicide, chromium silicide, tantalum silicide, platinum silicide, nickel silicide, niobium silicide, and palladium silicide.

70. The semiconductor device of claim 69 wherein the silicide is cobalt silicide.

71. The semiconductor device of claim 68 wherein the junction diode comprises:
- a first layer of heavily doped semiconductor material of a first conductivity type;
- a second layer of lightly doped semiconductor material of a second conductivity type or of intrinsic, undoped semiconductor material, the second layer on and in contact with the first layer; and
- a third layer of heavily doped semiconductor material of the second conductivity type, the third layer on and in contact with the second layer.

72. The semiconductor device of claim 71 wherein the semiconductor material is polysilicon or polysilicon-germanium.

73. The semiconductor device of claim 68 wherein the junction diode and contact-antifuse unit are portions of a memory cell.

74. The semiconductor device of claim 73 wherein the memory cell is a portion of a memory array.

75. The semiconductor device of claim 74 wherein the memory array is a monolithic three dimensional memory array, the array comprising at least a first memory level formed at a first height and a second memory level formed at a second height different from the first height.

76. A monolithic three dimensional memory array comprising a memory cell, the memory cell comprising:
- a vertical junction diode; and
- a contact-antifuse unit, the unit comprising a silicide layer and an antifuse layer, wherein the silicide layer is in contact with the antifuse layer,
- wherein the contact-antifuse unit is in contact with the junction diode and
- wherein the memory array comprises at least a first memory level at a first height and a second memory level at a second height different from the first height.

77. The memory array of claim 76 wherein the junction diode comprises polysilicon or polysilicon-germanium or germanium.

78. The memory array of claim 77 wherein the silicide is selected from the group consisting of cobalt silicide, chromium silicide, tantalum silicide, platinum silicide, nickel silicide, niobium silicide, and palladium silicide.

79. The semiconductor device of claim 78 wherein the antifuse layer comprises a dielectric grown on the silicide.

80. The semiconductor device of claim 79 wherein the dielectric is silicon oxide.

81. The semiconductor device of claim 79 wherein the dielectric is silicon nitride.

82. The semiconductor device of claim 79 wherein the dielectric is silicon oxynitride.

83. The semiconductor device of claim 79 wherein the contact-antifuse unit is above the junction diode.

84. The semiconductor device of claim 79 wherein the contact-antifuse unit is below the junction diode.

85. The semiconductor device of claim 77 wherein the junction diode comprises:
- a first heavily doped polysilicon layer of a first conductivity type;
- a second layer of a) lightly doped polysilicon of a second conductivity type or of b) undoped polysilicon, the second layer on an in contact with the first layer; and
- a third heavily doped polysilicon layer of the second conductivity type.

* * * * *